United States Patent [19]

Suzuki et al.

[11] Patent Number: 5,087,497
[45] Date of Patent: Feb. 11, 1992

[54] ELECTRIC CIRCUIT SUBSTRATE

[75] Inventors: Koji Suzuki; Minoru Tanaka, both of Yokohama, Japan

[73] Assignees: Canon Kabushiki Kaisha; Canon Seiki Kabushiki Kaisha, Tokyo, Japan

[21] Appl. No.: 470,349

[22] Filed: Jan. 25, 1990

Related U.S. Application Data

[63] Continuation-in-part of Ser. No. 363,920, Jun. 9, 1989, abandoned.

[30] Foreign Application Priority Data

Jun. 13, 1988 [JP] Japan .............. 63-077861[U]

[51] Int. Cl.$^5$ .............................. B32B 3/02
[52] U.S. Cl. .............................. 428/64; 428/137; 428/209; 428/901; 428/76; 156/60; 156/196; 156/217; 156/244.18; 174/52.2
[58] Field of Search .............. 428/137, 209, 901, 76; 357/72, 81; 156/60, 196, 217, 244.18; 174/52.2

[56] References Cited

U.S. PATENT DOCUMENTS

| | | | |
|---|---|---|---|
| 4,408,220 | 10/1983 | Calabro | 357/81 |
| 4,688,864 | 8/1987 | Sorel | 439/74 |
| 4,894,706 | 1/1990 | Sato et al. | 357/72 |
| 4,896,977 | 1/1990 | Takagi et al. | 400/120 |

FOREIGN PATENT DOCUMENTS

| | | |
|---|---|---|
| 52-40907 | 3/1977 | Japan . |
| 53-1012 | 1/1978 | Japan . |
| 53-16108 | 2/1978 | Japan . |
| 53-16109 | 2/1978 | Japan . |
| 54-41921 | 3/1979 | Japan . |

Primary Examiner—Patrick J. Ryan
Attorney, Agent, or Firm—Fitzpatrick, Cella, Harper & Scinto

[57] ABSTRACT

On an electric circuit substrate comprising an electric circuit, a radiator plate is placed for heat radiation of an integrated circuit structure and a transistor which emits heat, and the integrated circuit structure and the transistor are placed on the radiator plate and a power supply terminal is integrally provided on the radiator plate.

10 Claims, 9 Drawing Sheets

ELECTRIC CIRCUIT SUBSTRATE

This invention is a continuation-in-part to U.S. patent application Ser. No. 363,920, filed on June 9, 1989, now abandoned.

BACKGROUND OF THE INVENTION

1. Field of the Invention

This invention relates to a compact DC motor incorporated with a speed control circuit, suitable for driving a capstan of a cassette tape recorder or the like.

2. Related Background Art

Motors for use in cassette recorders with radio sets and car cassette recorders are often used at a very wide range of environmental temperatures from −10° C. to 70° C.

In such cases, particularly in a motor of the type containing therein a speed control circuit designed to hold the speed constant by an electronic circuit, the thermal influence to which a speed control system is subjected due to an increase in the heat generated from an armature coil by driving the motor, the heat generated by supplying electric power to an electronic part such as a control IC or a control transistor, and further the heat generated in the armature coil by an electric current flowing to the armature coil being increased by an increase in the load of the instrument used caused by a change in the environment of use, and an increase in the amount of generated heat resulting from an increase in the electric current flowing into the electronic part such as the control IC or the control transistor, is great. Therefore, it has sometimes been the case that aggravation of the time drift of the rotational speed, aggravation of the rotational speed versus temperature characteristic, etc. occur.

FIG. 9 of the accompanying drawings is a longitudinal cross-sectional view illustrating a motor of this type according to the prior art. FIG. 10 of the accompanying drawings is a fragmentary perspective view showing the motor of FIG. 9 with a cap removed therefrom.

In FIGS. 9 and 10, in the prior-art compact DC motor with a speed control circuit, an electronic part 2 such as a control IC or a control transistor is directly secured to a circuit substrate 1 as by soldering, and the heat generated by supplying electric power to the electrical part warms the circuit substrate 1 directly and therefore, other electric parts mounted on the circuit substrate 1 are also warmed more than necessary. This has sometimes led to a result that the normal step of a speed control system changes to fluctuate the rotational speed and thereby reduce the accuracy of speed control.

Also, a power supply terminal has been provided on a lug 1a provided by protruding a part of the circuit substrate 1 radially thereof, and this has also led to the problem that the circuit substrate 1 protrudes from the outer diameter of a motor case 8 and the apparent outer diameter of the motor becomes so great that the mounting of the motor to a compact instrument becomes difficult.

FIG. 11 of the accompanying drawings is a longitudinal cross-sectional view showing another example of the structure of the prior-art compact DC motor. FIG. 12 is a fragmentary perspective view showing the motor of FIG. 11 with a cap removed therefrom.

In FIGS. 11 and 12, an electronic part 2 such as a control IC or a control transistor which is a part of a heat generating source in the motor is led out of the motor and is mounted on the protruding portion 1a of a circuit substrate 1 in intimate contact with the outer surface of a motor case 8.

In this structure, it is necessary to form a planar portion 8a on the motor case 8 in order to bring the electronic part 2 into intimate contact with the motor case 8 and therefore, the working of the motor case 8 which is a press-molded article has become difficult and moreover, a problem has sometimes arisen in the maintenance and checking of the press metal mold.

Again in this case, the lug 1a of the circuit substrate 1 protrudes from the outer diameter of the motor, and this has led to the problem that the apparent outer diameter of the motor becomes great and the mounting of the motor to a compact instrument becomes difficult.

Further, the protruding portion 1a of the circuit substrate 1 is relatively large, and this has also led to the problem that this protruding portion is liable to be broken or otherwise damaged.

SUMMARY OF THE INVENTION

It is a first task of the present invention to provide an electric circuit substrate which can enhance the heat radiation effect of an electrical part such as an integrated circuit structure or a transistor which generates heat.

The present invention further provides an electric circuit substrate on which a radiator plate for supporting said electric part thereon is provided and in which a power supply terminal is integrally provided on the radiator plate, thereby supplying the heat radiation and power supply to the electric circuit substrate.

It is also a task of the present invention to provide an electric circuit substrate which is to be received in the cylindrical motor case of a motor or the like and which is suitable for the heat radiation of said electrical part and the power supply from the outside of said motor case.

The present invention further provides an electric circuit substrate which is suitable for the assembly of the power supply terminal of a radiator plate serving both said heat radiation and said power supply.

DESCRIPTION OF THE PREFERRED EMBODIMENTS

The present invention will hereinafter be specifically described with reference to FIGS. 1 to 8.

Figure 1:
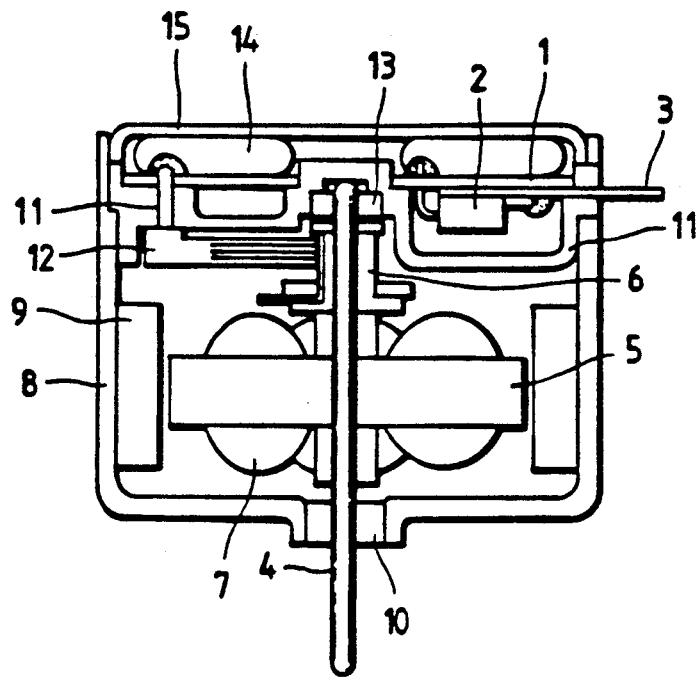
FIG. 1 is a longitudinal cross-sectional view of an embodiment of a compact DC motor according to the present invention.

FIG. 1 is a longitudinal cross-sectional view of an embodiment in which an electric circuit substrate according to the present invention is applied to a compact DC motor.

In FIG. 1, the reference numeral 1 designates the circuit substrate of the speed control circuit of a motor, the reference numeral 2 denotes a control IC or a control transistor which is a part of an electronic circuit, and the reference numeral 3 designates a radiator plate and terminal plate.

An armature core 5 of laminated structure and a commutator 6 are fixed to a motor shaft 4 by means such as caulking or press-in. An armature coil 7 is wound on the armature core 5, and the end of the armature coil 7 is soldered to the terminal of the commutator 6.

The reference numeral 8 designates a motor case. A magnet 9 opposed to the outer periphery of the armature core 5 with an air gap therebetween is fixed to the inner peripheral surface of the motor case 8, and a bearing 10 supporting the motor shaft 4 is fixed to the central opening portion of the front face of the motor case 8.

A bracket 11 and an end cap 15, both made of plastics, are fixed to the rear open surface of the motor case 8.

Metal brushes 12 slidably contacting with the commutator 6 and a bearing 13 supporting the rear end of the motor shaft 4 are mounted on the bracket 11.

The part mounting surface of the circuit substrate 1 is joined to the outer side surface of the bracket 11, and a sponge 14 is compressedly held between the circuit pattern surface of the circuit substrate 1 and the inner surface of the cap 15.

The metal brushes 12 are mounted in a set at 180° opposite locations, and their terminals for conduction and connection are connected as by soldering to the circuit pattern surface of the circuit substrate 1 joined to the opposite surface of the bracket 11.

The sponge 14 is compressed and urged against the circuit pattern surface of the circuit substrate 1 by the cap 15, and absorbs any vibration occurring to the bracket 11 and the circuit substrate 1 and reduces mechanical noise.

The cap 15 is pressed into the motor case 8, and magnetically shields the motor and reduces electrical noise.

In the compact DC motor of FIG. 1, the metallic radiator plate 3 serving also as power supply terminals $3C_2$ and $3C_3$ (FIG. 2) to the motor and a grounding terminal $3C_1$ (FIG. 2) is mounted in intimate contact between the electronic part 2 such as the control IC or the control transistor and the part mounting surface of the circuit substrate 1.

That is, the radiator plate and terminal plate 3 is mounted in intimate contact with the part mounting surface of the circuit substrate 1 and further, the terminals $3B_1$, $3B_2$ and $3B_3$ of the radiator plate are soldered to the circuit pattern surface of the circuit substrate 1, and the electronic part 2 such as the control IC or the control transistor is soldered to said circuit pattern surface.

Figure 2:
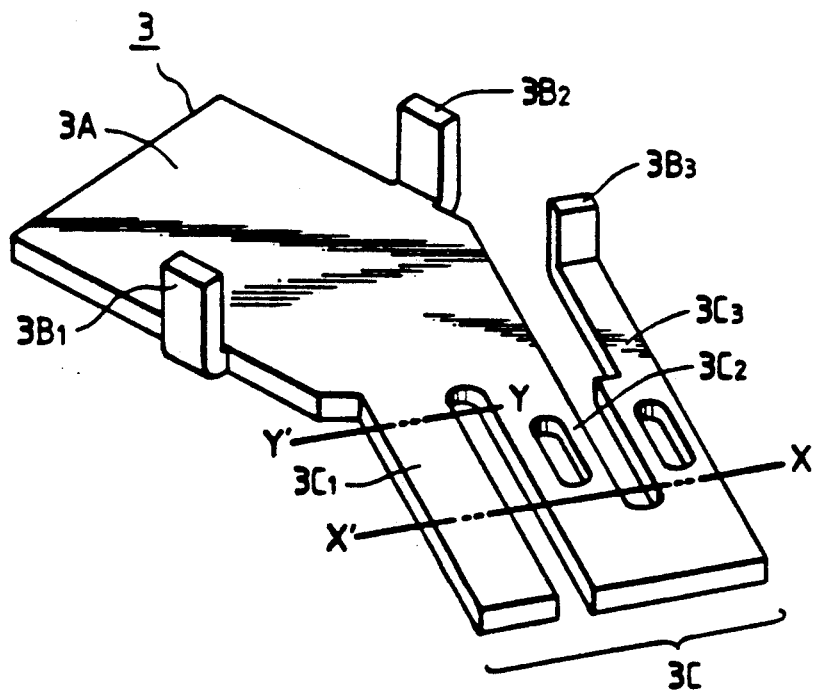
FIG. 2 is a perspective view of a radiator plate and terminal plate in FIG. 1.

FIG. 2 is a perspective view of the radiator plate and terminal plate 3.

In FIG. 2, the radiator plate and terminal plate 3 is made by press-working a brass or electrodetinued steel plate or a metal excellent in radiating effect.

The radiator plate 3 comprises an electrical part supporting portion 3A, engagement portions $3B_1$, $3B_2$ and $3B_3$ for bringing the radiator plate into engagement with the circuit substrate 1, and power supply terminal portions $3C_1$, $3C_2$ and $3C_3$.

The engagement portions $3B_1$ and $3B_2$ are bent up from the opposite sides of the supporting portion 3A, and the other engagement portion $3B_3$ is cocked by bending the free end of the power supply terminal portion $3C_3$.

The power supply terminal portion 3C has a predetermined angle of inclination with respect to the supporting portion 3A to receive a supply of electric power from the outside of the motor case which will be described later, and the supporting portion 3A is superposed upon the circuit substrate. The supply terminal portion 3C is constructed so as to protrude outwardly of the motor case.

The press work of the radiator plate 3 is accomplished by punching it into the shape shown in FIG. 2, and cutting it along line X-X' as will be described later.

Figure 3:
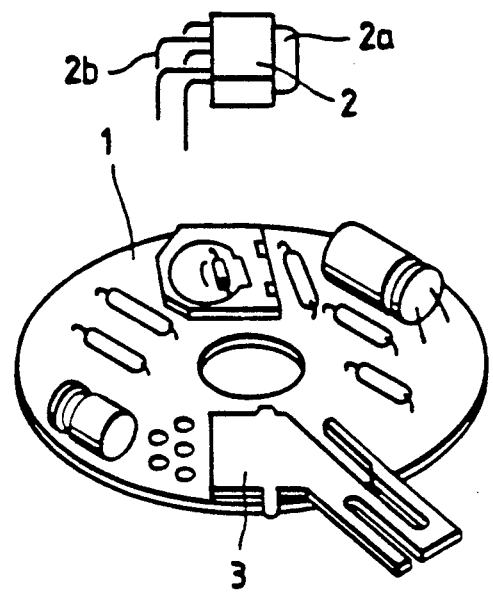
FIG. 3 is a perspective view showing the radiator plate and terminal plate as it is mounted on a circuit substrate.
Figure 4:
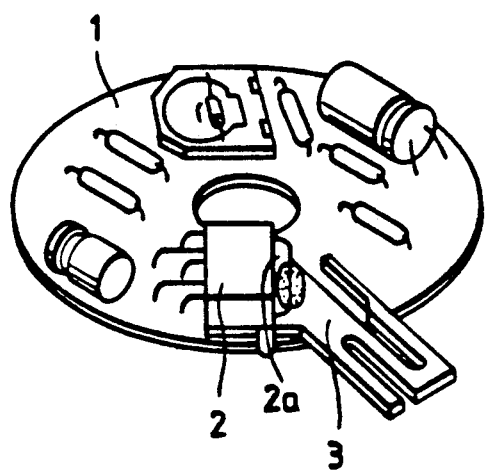
FIG. 4 is a perspective view showing electronic parts as they are further mounted on the circuit substrate of FIG. 3.

FIG. 3 shows the radiator plate and terminal plate 3 as it is mounted on the part mounting surface of the circuit substrate 1, and FIG. 4 shows the part 2 such as the control IC or the control transistor as it is further mounted on said part mounting surface.

Figure 5:
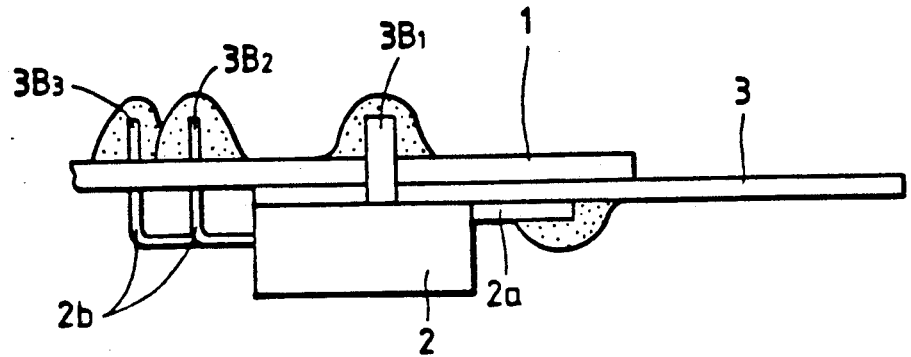
FIG. 5 is a longitudinal cross-sectional view corresponding to FIG. 4.

FIG. 5 is a cross-sectional side view showing the mounted state of FIG. 4.

According to the arrangement of the electric circuit parts of FIG. 3, the radiator plate and terminal plate 3 is mounted by the engagement portions $3B_1$, $3B_2$ and $3B_3$ thereof being soldered to the circuit pattern surface of the circuit substrate 1.

According to FIGS. 4 and 5, the electronic part 2 such as the control IC or the control transistor is mounted in intimate contact with the electric circuit supporting portion 3A of the radiator plate and terminal plate 3 mounted on the circuit substrate 1 by soldering, with the terminal portion thereof being soldered to the circuit pattern surface of the circuit substrate 1.

The electronic part 2 such as the control IC or the control transistor is provided with a radiator fin 2a, and this electronic part 2 is mounted by the radiator fin 2a being soldered and fixed to a portion of the radiator plate and terminal plate 3 in intimate contact with the latter and the leg 2b thereof being electrically connected to the circuit pattern portion of the circuit substrate 1 by soldering.

As is apparent from the shapes of the power supply terminals $3C_2$ and $3C_3$ of the radiator plate and terminal plate 3 shown in FIG. 2 and the locations of the connecting portions $3B_3$ and $3B_2$ soldered to the circuit substrate 1, these power supply terminals do not function as power supply terminals if they remain in the shapes shown in FIG. 2. Therefore, the fore end of the power supply terminal portion 3C of the radiator plate and terminal plate 3 is cut along the line X-X' indicated in FIG. 2, and the cut-off terminal $3C_3$ is used as a plus power supply terminal and the cut-off terminal $3C_2$ is used as a minus power supply terminal.

Figure 6:
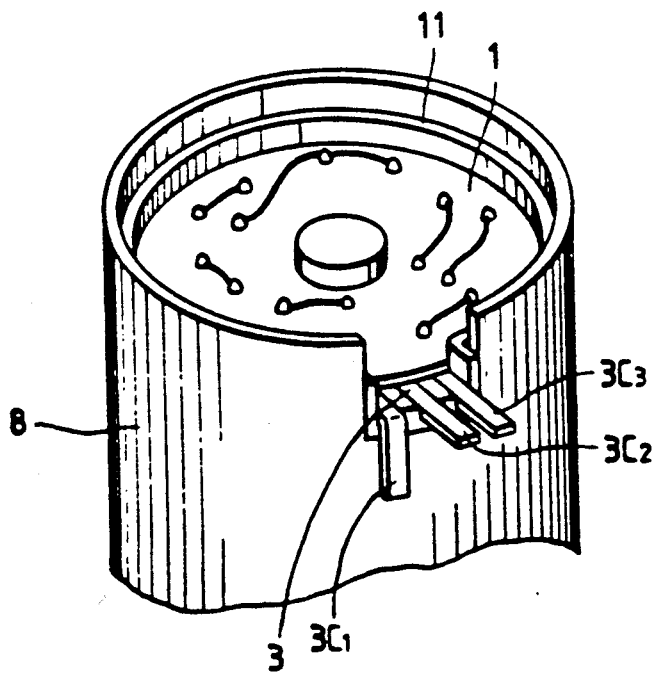
FIG. 6 is a fragmentary perspective view showing the rear end portion of the motor of FIG. 1 with a cap removed therefrom.

Also, the terminal portion $3C_1$ is bent along line Y-Y' as shown by the terminal $3C_1$ in FIG. 6, and is spot-welded to the motor case 8 and is grounded through the motor case 8. The bending of this grounded terminal $3C_1$ and the fixing thereof to the motor case 8 are as shown in FIG. 6.

In the structure of the embodiment described above with reference to FIGS. 1-6, when electric power is supplied to the power supply terminals $3C_2$ and $3C_3$, heat is generated in the electronic part 2 (such as the control IC or the control transistor), and part of this heat is transferred along the lead of the electronic part 2 and radiated to the circuit substrate 1, but most of the heat is transmitted to the radiator plate and terminal plate 3 soldered to the radiator fin 2a of the electronic part 2 in intimate contact therewith, and is further radiated to the motor case 8 through the grounded terminal $3C_1$ which is a terminal common to the power supply terminal $3C_2$.

Accordingly, even if a change in the driving condition such as an increase in the load applied to the motor occurs and the electric current flowing into the electronic part 2 (such as the control IC or the control transistor) changes and correspondingly the amount of heat generated in the electronic part 2 changes, the other electronic parts disposed on the circuit substrate 1 are hardly affect by said change in the amount of generated heat and the constant of the speed control system can be kept stable. Thus, highly accurate speed control can be executed.

Figure 7:
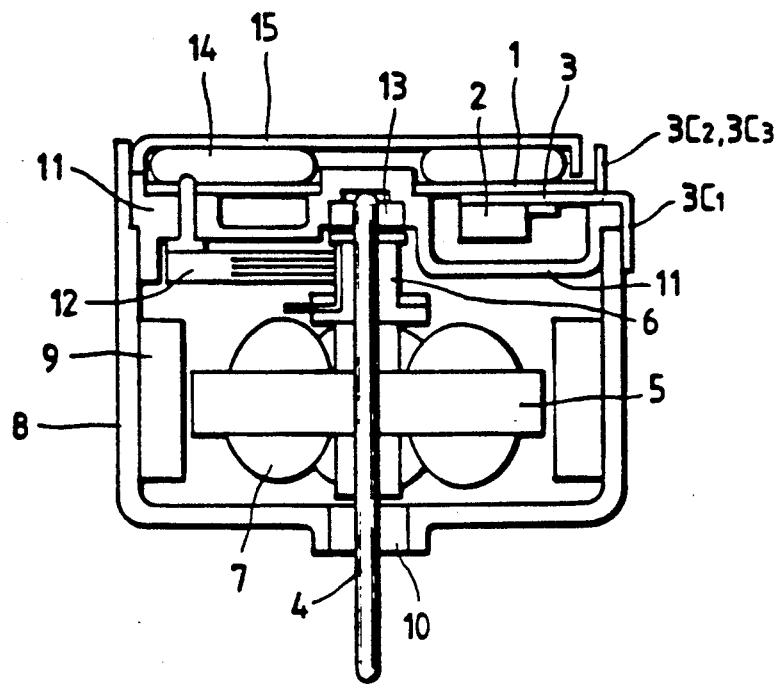
FIG. 7 is a longitudinal cross-sectional view of another embodiment of the compact DC motor according to the present invention.
Figure 8:
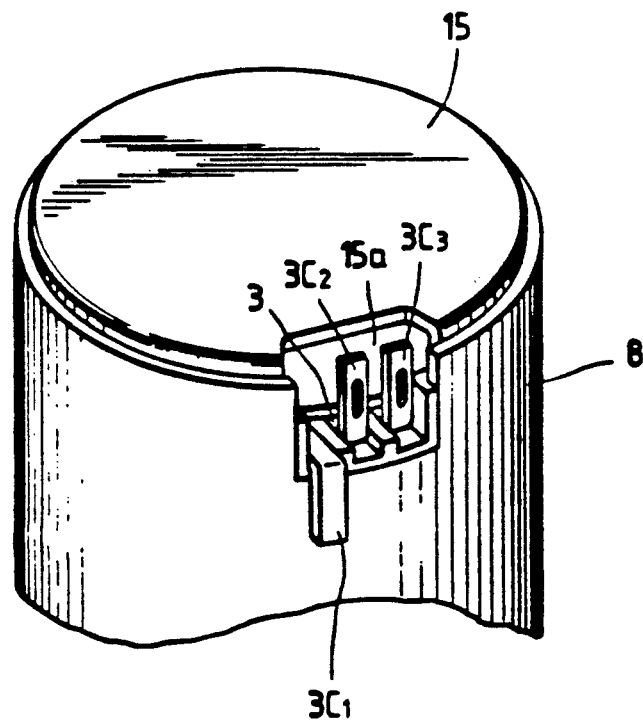
FIG. 8 is a fragmentary perspective view of the rear end portion of the motor of FIG. 7.
Figure 9:
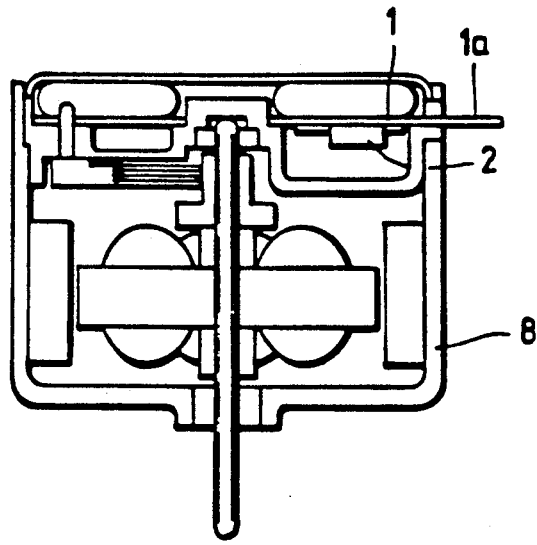
FIG. 9 is a longitudinal cross-sectional view showing an example of a compact DC motor according to the prior art.
Figure 10:
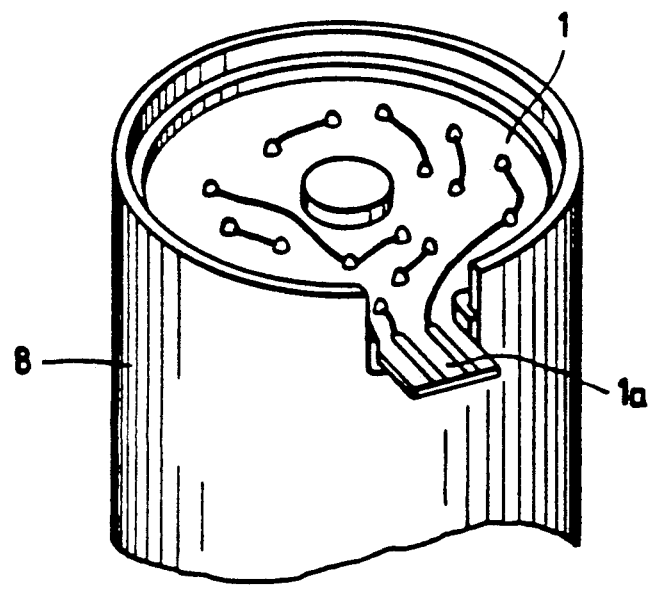
FIG. 10 is a fragmentary perspective view of the rear end portion of the motor of FIG. 9 with a cap removed therefrom.
Figure 11:
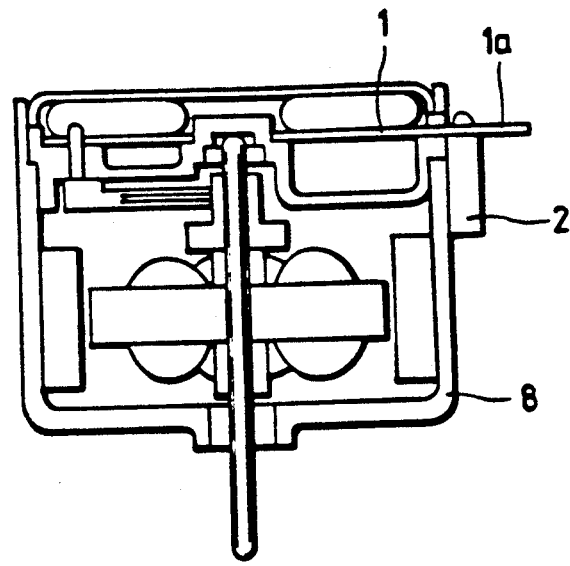
FIG. 11 is a longitudinal cross-sectional view showing another example of the structure of the compact DC motor according to the prior art.
Figure 12:
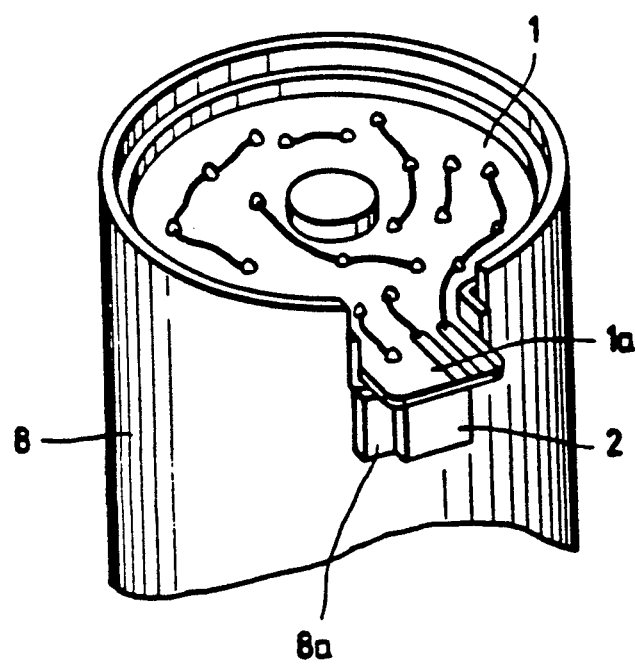
FIG. 12 is a fragmentary perspective view of the rear end portion of the motor of FIG. 11 with a cap removed therefrom.

FIG. 7 is a longitudinal cross-sectional view of a compact DC motor according to another embodiment of the present invention, and FIG. 8 is a fragmentary perspective view showing the mounted state of the radiator plate and terminal plate 3 of the motor of FIG. 7.

Again in FIGS. 7 and 8, portions substantially similar in construction and function to those in the embodiment of FIGS. 1-6 are given similar reference numerals.

In FIGS. 7 and 8, a recess 15a is formed in the rear end portion of the motor case 8 and the outer diameter portion of the cap 15, the power supply terminals $3C_2$ and $3C_3$ of the radiator plate and terminal plate 3 are bent upwardly and received in the recess 15a, and the grounded terminal $3C_1$ is bent downwardly as in the case of FIG. 6 and secured to the outer surface of the motor case 8 as by spot welding.

The recess 15a can be formed irrespective of the presence or absence of the bending of the power supply terminals $3C_2$ and $3C_3$.

According to the embodiment of FIGS. 7 and 8, it becomes possible to provide the radiator plate and terminal plate 3 also without projecting it from the outer diameter of the motor case 8, and the same operational effect as that of the embodiment of FIGS. 1-6. In addition, the outer diameter of the motor can be further reduced to make the assembly thereof to a compact instrument easier. Further, the possibility of the radiator plate and terminal plate 3 being damaged by any abnormal force applied thereto due to external factors can be eliminated.

FIGS. 13 to 17 show another embodiment of the present invention.

Figure 13:
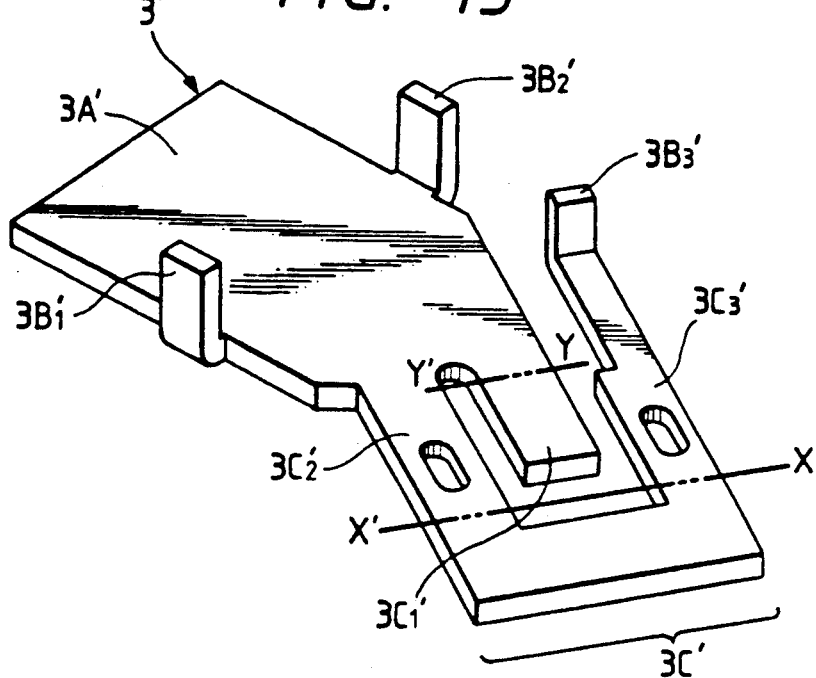
FIG. 13 is a perspective view of an another embodiment of a radiator plate and terminal plate in FIG. 1.

In FIG. 13, the radiator plate 3' comprises an electrical part supporting portion 3A', engagement portions $3B'_1$, $3B'_2$ and $3B'_3$ for bringing the radiator plate into engagement with the circuit substrate 1, and power supply terminal portions $3C'_1$, $3C'_2$ and $3C'_3$.

The engagement portions $3B'_1$ and $3B'_2$ are bent up from the opposite sides of the supporting portion 3A', and the other engagement portion $3B'_3$ is cocked by bending the free end of the power supply terminal portion $3C'_3$.

The power supply terminal portion 3C' has a predetermined angle of inclination with respect to the supporting portion 3A' to receive a supply of electric power from the outside of the motor case which will be described later, and the supporting portion 3A' is superposed upon the circuit substrate, and the power supply terminal portion 3C' is constructed so as to protrude outwardly of the motor case.

The press work of the radiator plate 3' is accomplished by punching it into the shape shown in FIG. 13, and cutting it along line X-X' as will be described later.

Figure 14:
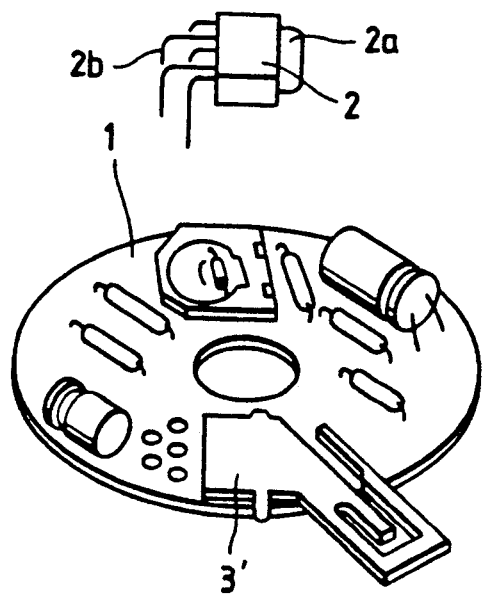
FIG. 14 is a perspective view showing the radiator plate and terminal plate as it is mounted on a circuit substrate.
Figure 15:
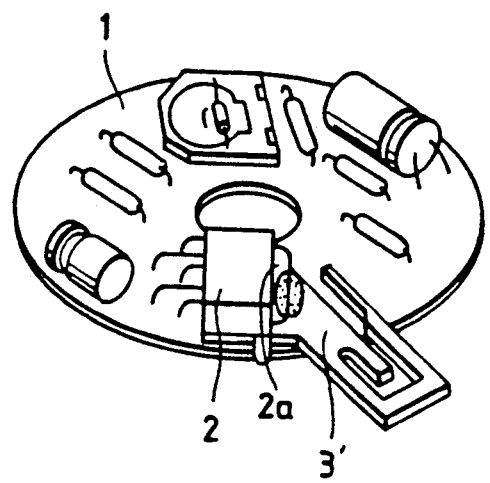
FIG. 15 is a perspective view showing electronic parts as they are further mounted on the circuit substrate of FIG. 14.

FIG. 14 shows the radiator plate and terminal plate 3' as it is mounted on the part mounting surface of the circuit substrate 1, and FIG. 15 shows the part 2 such as the control IC or the control transistor as it is further mounted on said part mounting surface.

According to the arrangement of the electric circuit parts of FIG. 14, the radiator plate and terminal plate 3' are mounted by the engagement portions $3B'_1$, $3B'_2$ and $3B'_3$ thereof being soldered to the circuit pattern surface of the circuit substrate 1.

According to FIG. 15, the electronic part 2 such as the control IC or the control transistor is mounted in intimate contact with the electric circuit supporting portion 3A' of the radiator plate and terminal plate 3' mounted on the circuit substrate 1 by soldering, with the terminal portion thereof being soldered to the circuit pattern surface of the circuit substrate 1.

The electronic part 2 such as the control IC or the control transistor is provided with a radiator fin 2a, and this electronic part 2 is mounted by the radiator fin 2a being soldered and fixed to a portion of the radiator plate and terminal plate 3' in intimate contact with the latter and the leg 2b thereof being electrically connected to the circuit pattern portion of the circuit substrate 1 by soldering.

As is apparent from the shapes of the power supply terminals $3C'_2$ and $3C'_3$ of the radiator plate and terminal plate 3' shown in FIG. 13 and the locations of the connecting portions $3B'_3$ and $3B'_2$ soldered to the circuit substrate 1, these power supply terminals do not function as power supply terminals if they remain in the shapes shown in FIG. 13. Therefore, the fore end of the power supply terminal portion 3C of the radiator plate and terminal plate 3' is cut along the line X-X' indicated in FIG. 13, and the cut-off terminal 3C'$_3$ is used as a plus power supply terminal and the cut-off terminal 3C'$_2$ is used as a minus power supply terminal.

Figure 16:
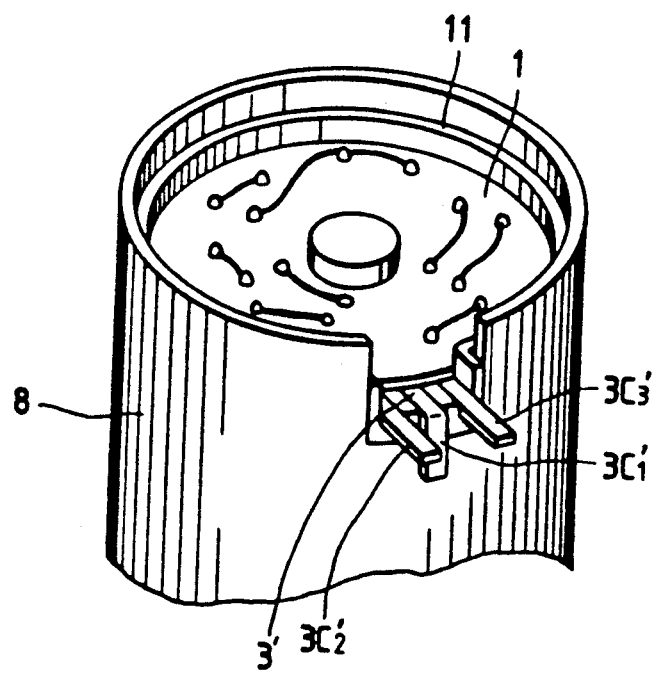
FIG. 16 is a fragmentary perspective view showing the rear end portion of the motor of FIG. 1 with a cap removed therefrom.

Also, the terminal portion 3C'$_1$ is bent along line Y-Y' as shown by the terminal 3C'$_1$ in FIG. 16, and is spot-welded to the motor case 8 and grounded through the motor case 8. The bending of this grounded terminal 3C'$_1$ and the fixing thereof to the motor case 8 are shown in FIG. 16.

In the structure of the second embodiment described above with reference to FIGS. 13 and 16, when electric power is supplied to the power supply terminals 3C'$_2$ and 3C'$_3$, heat is generated in the electronic part 2 (such as the control IC or the control transistor), and part of this heat is transferred along the lead of the electronic part 2 and radiated to the circuit substrate 1, but most of the heat is transmitted to the radiator plate and terminal plate 3' soldered to the radiator fin 2a of the electronic part 2 in intimate contact therewith, and is further radiated to the motor case 8 through the grounded terminal 3C'$_1$ which is a terminal common to the power supply terminal 3C'$_2$.

Accordingly, even if a change in the driving condition such as an increase in the load applied to the motor occurs and the electric current flowing into the electronic part 2 (such as the control IC or the control transistor) changes and correspondingly the amount of heat generated in the electronic part 2 changes, the other electronic parts disposed on the circuit substrate 1 are hardly affected by said change in the amount of generated heat and the constant of the speed control system can be kept stable. Thus, highly accurate speed control can be executed.

Figure 17:
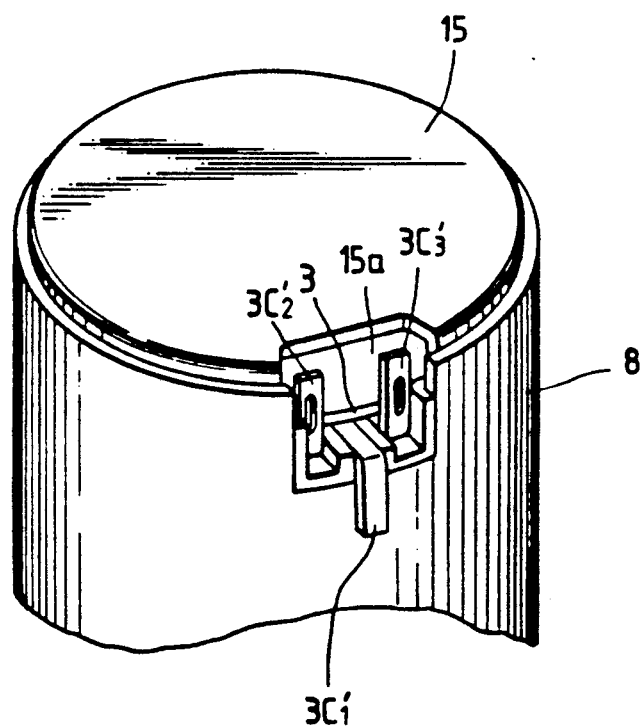
FIG. 17 is a fragmentary perspective view of the rear end portion of the motor of FIG. 7.

FIG. 17 is a fragmentary perspective view showing the mounted state of the radiator plate and terminal plate 3 of the motor of FIG. 7.

Again in FIG. 17, portions substantially similar in construction and function to those in the embodiment of FIGS. 1-6 and FIGS. 13-16 are given similar reference numerals.

In FIG. 17, a recess 15a is formed in the rear end portion of the motor case 8 and the outer diameter portion of the cap 15, the power supply terminals 3C'$_2$ and 3C'$_3$ of the radiator plate and terminal plate 3 are bent upwardly and received in the recess 15a, and the grounded terminal 3C'$_1$ is bent downwardly as in the case of FIG. 6 and secured to the outer surface of the motor case 8 by spot welding.

The recess 15a can be formed irrespective of the presence or absence of the bending of the power supply terminals 3C'$_2$ and 3C'$_3$.

According to the embodiment of FIGS. 17, it becomes possible to provide the radiator plate and terminal plate 3' without projecting it from the outer diameter of the motor case 8, and the same operational effect as that of the embodiment of FIGS. 13-16 and in addition, the outer diameter of the motor can be further reduced to make the assembly thereof to a compact instrument easier. Further, the possibility of the radiator plate and terminal plate 3' being damaged by any abnormal force applied thereto due to external factors can be eliminated.

According to the present invention, power supply terminals are integrally provided on the radiator plate and therefore, the heat radiation of and power supply to the electrical parts can be accomplished by a single part.

Further, the circuit substrate according to the present invention is of a construction in which the power supply terminal portion 3C is inclined by a predetermined angle with respect to the radiator portion 3A for the heat radiation of the electrical parts, whereby where this circuit substrate is used in a motor, only the power supply terminals can be led out to the outside of the motor case. Also, the radiator plate used in the circuit substrate of the present invention is made of a single member common to the engagement portions 3B$_1$ and 3B$_2$ for bringing the radiator plate 3 into engagement with the circuit substrate 1 and to the power supply terminals 3C$_2$ and 3C$_3$ and therefore, by soldering the engagement portions 3B$_1$ and 3B$_2$ into the pattern of the circuit substrate 1, the holding of the radiator plate and connection to the power source can be accomplished easily.

Furthermore, in accordance with the second embodiment of the present invention shown in FIGS. 13 to 17, the plus terminal 3C'$_3$ and the minus terminal 3C'$_2$ are formed by cutting off a single terminal part which elongating over the ground terminal 3C'$_1$. By this arrangement, the ground terminal 3C'$_1$ is provided between the plus terminal 3C'$_3$ and the minus terminal 3C'$_2$, and a possibility of shortcircuit between the power supply terminals is prevented more certainly.

While the circuit substrate of the present invention has been described as an embodiment of the circuit substrate of the control circuit of a motor, it can also be applied to other electrical instruments than a motor.

We claim:

1. A circuit substrate to be used in an electric apparatus, comprising:

a circuit substrate having on one surface thereof a copper film pattern for electrically connecting electrical parts, said circuit substrate having a plurality of through-holes formed therein;

electrical parts having terminals soldered to said copper film pattern surface through the through-holes formed in said circuit substrate; and a radiator plate having a supporting portion for supporting one or more electrical parts thereon, a supply terminal for supplying electrical power to said circuit substrate, and a terminal for radiation heat accumulated in the electric apparatus, with said radiator plate being secured to come into contact with a surface of said circuit substrate opposite to said copper film pattern surface to supply the electrical power from said supply terminal, and said heat radiating terminal also serving as a ground terminal.

2. A circuit substrate according to claim 1, wherein said radiator plate includes at least one engaging portion for bringing said radiator into engagement with said circuit substrate, wherein said engagement portion, said supply terminal, and said heat radiating and ground terminal are connected together by an electrical conductor, and said engagement portion is fixed in said copper circuit pattern of said circuit substrate, and said engagement portion is soldered to said copper pattern to thereby supply electrical power from said supply terminal to said pattern.

3. A circuit substrate to be used in an electrical apparatus, comprising:

a disk shaped circuit substrate having on one surface thereof a copper film pattern for electrically connecting electrical parts and having a plurality of through-holes formed therein;

electrical parts having terminals soldered to said copper film pattern surface through the through-holes formed in said circuit substrate; and a radiator plate having a supporting portion for supporting said electrical parts thereon, an engaging portion extending from said supporting portion to be soldered to said copper film pattern surface, an electric supply terminal extending laterally from said supporting portion and outwardly from said circuit substrate at a predetermined angle so as to be connected with a lead wire of a power source, and a terminal to be electrically and thermally connected with the electric apparatus.

4. A motor, comprising:
a motor case;
a circuit substrate having a motor control circuit, and circuit substrate having a circuit pattern thereon to which electric parts are connected; and
a radiator plate fixed to said circuit substrate, said radiator plate having a supporting portion for supporting the electrical parts thereon, an electric supply terminal for supplying electrical power to said control circuit formed on said circuit substrate, and a ground terminal connected with said electric circuit.

5. A motor according to claim 4, wherein said ground terminal extends outwardly from said motor case and is bent to be in contact with said motor case.

6. A motor, comprising:
a motor case;
a circuit substrate having a motor control circuit, said circuit substrate having a circuit pattern thereon to which electrical parts are connected;
a radiator plate fixed to said circuit substrate, said radiator plate having a supporting portion for supporting the electrical parts, an electric supply terminal for supplying an electrical power to said circuit substrate, and a ground terminal; and
an electrical part having a radiation fin portion connected proximate to said radiator plate, with a lead wire of said electrical part being soldered to said circuit pattern.

7. A motor according to claim 6, further comprising:
cap means for covering said motor case, with said motor case and said cap means having an opening through which said electric supply terminal and ground terminal extend, and said ground terminal extends outwardly from said motor case and is bent to contact an outer surface of said motor case.

8. A method for attaching a radiator plate to a circuit substrate, comprising the steps of:
preparing the circuit substrate having on one surface thereof a circuit pattern for electrically connecting electrical parts;
fixing the radiator plate to the circuit substrate, with the circuit substrate having a supporting portion for supporting electrical parts and a terminal portion for supplying electric power to the circuit pattern, and the terminal portion having a ground terminal extending from the supporting portion and a power supply terminal extending from the supporting portion and having a portion to be bent; and
cutting the bent portion of the power supply terminal to form a plus power supply terminal and a minus power supply terminal.

9. A circuit substrate for an electric apparatus, comprising:
a case for housing the electric apparatus;
a circuit substrate having an electric circuit comprising electrical parts connected to a circuit pattern formed thereon;
a radiation plate fixed to said circuit substrate, said radiation plate having a support portion for supporting said electrical parts, plus and minus terminals for supplying electric power to said circuit pattern, and a ground terminal provided between said plus terminal and said minus terminal.

10. A circuit substrate according to claim 9, wherein one of said plus terminal or minus terminal extends from said support portion, with said extended terminal surrounding said ground terminal and terminating at a portion close to a root portion of said ground terminal, with said surrounding portion being cut off to form said plus terminal and said minus terminal independently.

* * * * *

UNITED STATES PATENT AND TRADEMARK OFFICE
CERTIFICATE OF CORRECTION

PATENT NO. : 5,087,497

DATED : February 11, 1992

INVENTOR(S) : Koji Suzuki, et al.

It is certified that error appears in the above-identified patent and that said Letters Patent is hereby corrected as shown below:

TITLE PAGE:

[73] ASSIGNEES:

"Tokyo, Japan" should read --both of Tokyo, Japan--.

COLUMN 8:

Line 47, "radiation" should read --radiating--.

COLUMN 9:

Line 21, "and" should read --said--.

Signed and Sealed this

Twenty-eighth Day of September, 1993

Attest:

BRUCE LEHMAN

Attesting Officer

Commissioner of Patents and Trademarks